United States Patent [19]

Rellick

[11] Patent Number: 4,655,864

[45] Date of Patent: Apr. 7, 1987

[54] DIELECTRIC COMPOSITIONS AND METHOD OF FORMING A MULTILAYER INTERCONNECTION USING SAME

[75] Inventor: Joseph R. Rellick, Wilmington, Del.

[73] Assignee: E. I. Du Pont de Nemours and Company, Wilmington, Del.

[21] Appl. No.: 715,970

[22] Filed: Mar. 25, 1985

[51] Int. Cl.$^4$ ............................................. B32B 31/06
[52] U.S. Cl. ...................................... 156/89; 156/242; 156/246; 501/15; 501/17; 501/20; 501/22; 501/61; 501/62; 501/73; 501/76; 501/102; 501/103; 501/128; 501/133
[58] Field of Search ......................... 156/89, 242, 246; 501/15, 17, 20, 22, 61, 62, 73, 76, 102, 103, 128, 133

[56] References Cited

U.S. PATENT DOCUMENTS

| | | | |
|---|---|---|---|
| 3,540,894 | 11/1970 | McIntosh | 501/153 |
| 3,717,487 | 2/1973 | Hurley et al. | 106/48 |
| 3,832,192 | 8/1974 | McIntosh | 501/18 |
| 3,857,923 | 12/1974 | Gardner et al. | 423/327 |
| 3,962,162 | 6/1976 | Schmank | 260/22 |
| 3,975,201 | 8/1976 | Greenstein | 501/15 |
| 3,988,405 | 10/1976 | Smith et al. | 264/63 |
| 4,080,414 | 3/1978 | Anderson et al. | 264/41 |
| 4,104,345 | 8/1978 | Anderson et al. | 264/43 |
| 4,133,690 | 1/1979 | Muller | 501/61 |
| 4,153,491 | 5/1979 | Swiss et al. | 156/89 |
| 4,183,991 | 1/1980 | Smiley et al. | 428/220 |
| 4,272,500 | 6/1981 | Eggerding et al. | 423/327 |
| 4,301,324 | 11/1981 | Kumar et al. | 174/68.5 |

FOREIGN PATENT DOCUMENTS

| | | | |
|---|---|---|---|
| 0045359 | 2/1982 | European Pat. Off. | 501/15 |
| 3002353 | 7/1980 | Fed. Rep. of Germany | 501/15 |
| 3033209 | 3/1978 | Japan | 501/15 |

*Primary Examiner*—Caleb Weston

[57] ABSTRACT

A casting composition for making dielectric green tapes comprising a dispersion of finely divided solids of (a) a noncrystallizable glass and (b) a mixture of refractory oxides in a solution of (c) organic polymer, which is readily depolymerizable at 825°–1025° C. in a nonoxidizing atmosphere, dissolved in (d) volatile nonaqueous solvent.

5 Claims, No Drawings

DIELECTRIC COMPOSITIONS AND METHOD OF FORMING A MULTILAYER INTERCONNECTION USING SAME

FIELD OF INVENTION

The invention relates to dielectric compositions, especially those which are useful in forming multilayer circuits.

BACKGROUND OF THE INVENTION

Multilayer thick film circuits have been used for many years to increase circuit functionality per unit of area. Moreover, recent advances in circuit technology have placed new demands on dielectric materials for this use. Heretofore, most of the dielectric materials used in multilayer circuits have been conventional thick film dielectric compositions. These are comprised of finely divided particles of dielectric solids and inorganic binders dispersed in an inert organic medium. Such thick film materials are usually applied by screen printing, though they may be applied by other means as well. Thick film materials of this type are very important and will continue to be so.

In constructing a multilayer circuit using thick film materials, it is necessary sequentially to print, dry and fire each functional layer before the next layer is applied. Thus, in a typical situation involving thick film multilayer circuits having, say, twenty layers, sixty separate processing steps are required as well as sixty inspections to assure the quality of each of the processed layers. Such a complex process is, of course, expensive both because of the great number of steps and because of the high yield losses which heretofore have been incident to such a complex procedure.

Another approach to this problem has been the use of dielectric tapes in which a large number of thin sheets of ceramic dielectric material, such as $Al_2O_3$, are laid down interspersed with alternating printed layers of conductive materials. However, because of the very high temperature, on the order of 1600° C., required to sinter $Al_2O_3$, it is necessary to use very high melting conductive materials such as molybdenum and tungsten. Unfortunately, molybdenum and tungsten have only moderate conductivity properties which make them less satisfactory for very high speed, highly complex circuitry. Moreover, multilayer circuits made with these materials must be fired at 1600° C. for quite long periods of time, which may approach 48 hours or more, to obtain adequate densification of the $Al_2O_3$.

From the foregoing, it can be seen that there is a great need for a dielectric system which (1) can be fired at lower temperatures, thus permitting the use of conventional conductive materials such as gold, copper, silver and palladium, (2) can be densified by firing only a few hours, (3) can be fired in a nonoxidizing atmosphere with good burnout of organics and (4) give production yields having good adhesion to rigid substrates, layer integrity and thermal expansion characteristics closely resembling the substrate, which is usually fired alumina.

BRIEF DESCRIPTION OF THE INVENTION

In view of the foregoing shortcomings of the prior art, the invention is directed in its primary aspect to a castable dielectric composition comprising a dispersion of finely divided solids comprising:

a. 40–70% vol. noncrystallizable glass having a softening point ($T_s$) of at least 500° C. and a viscosity ($\eta$) of $1 \times 10^6$ poises or less at 825°–1025° C.; and b. 60–30% vol. of a mixture of refractory oxides comprising 1–59% vol. $Al_2O_3$ and 59–1% volume of a secondary refractory selected from α-quartz, $CaZrO_3$, fused silica, cordierite, mullite and mixtures thereof, the maximum amount of α-quartz, $CaZrO_3$ or fused silica being 20% vol., basis total inorganic solids, in a solution comprising c. a polymeric binder selected from poly(α-methyl styrene) and polymers of methacrylate corresponding to the formula:

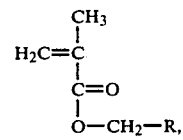

in which R is selected from —H and

in which (1) $R_1$, $R_2$ and $R_3$ are independently selected from —H, alkyl, alkaryl and aralkyl groups and (2) no more than one of $R_1$, $R_2$ and $R_3$ is —H, the glass transition temperature of the polymer, including any plasticizer therein, is −30° to +20° C., dissolved in d. volatile nonaqueous organic solvent, the volume of polymeric binder and plasticizer being 30–55% of the volume of the inorganic solids a. and b.

In a second aspect, the invention is directed to a method of forming green tape by casting a thin layer of the above-described dispersion onto a flexible substrate, such as a steel belt or polymeric film, and heating the cast layer to remove the volatile solvent therefrom.

In a third aspect, the invention is directed to a method for forming a multilayer interconnection comprising the steps of:

a. printing and firing a patterned layer of thick film conductor composition on an inert ceramic substrate;

b. forming a patterned array of vias in one or more layers of green tape made by the process of claim 4;

c. laminating the green tape layer(s) of step b., having vias therein, over the printed side of the assemblage of step a. and firing the assemblage at 825°–1025° C. to form a densified layer of dielectric;

d. filling the vias in the densified dielectric layer of step c. with thick film conductor composition and firing the assemblage;

e. printing and firing at least one patterned thick film functional layer over the fired assemblage of step d.; and f. repeating the sequence of steps b. through e. for a number of times sufficient to build up a predetermined number of interconnected functional layers, each separated by a layer of densified dielectric.

PRIOR ART

It is well known to employ "green tapes" in the fabrication of multilayer circuits. Such green tapes are made by casting a dispersion of the dielectric material in a polymeric binder latex or solution of polymeric binder in volatile organic solvent onto a flexible substrate, such as a steel belt or polymeric film, and then heating the cast layer to remove the volatile solvent therefrom. Such green tapes and their applications are disclosed in many patents; for example, the following:

Swiss et al. in U.S. Pat. No. 4,153,491 disclose a green ceramic sheet material comprising $Al_2O_3$ and glass frit dispersed in a binder of organic material.

Hurley et al. in U.S. Pat. No. 3,717,487 disclose a ceramic slip concentrate comprising inter alia $Al_2O_3$ dispersed in a slip containing a polymethacrylate binder, solvent and a dispersing agent.

In U.S. Pat. No. 3,857,923, Gardner et al. disclose a ceramic green tape comprising mullite dispersed in a binder such as poly(vinyl butyral).

Schmank in U.S. Pat. No. 3,962,162 discloses a casting solution for making green ceramic sheet comprising refractory powder such as $Al_2O_3$ dispersed in a solution of polyester, crosslinking monomer, free radical initiator and mold release compound.

U.S. Pat. No. 3,988,405 to Smith et al. discloses a casting composition comprising a ceramic material, especially a glass ceramic, dispersed in an acrylic copolymer latex in which one of the comonomers is a polymerizable carboxylic acid.

U.S. Pat. No. 4,080,414 and 4,104,345 to Anderson et al. are directed to ceramic green sheets prepared from a casting solution containing both a solvent and nonsolvent for the organic binder.

U.S. Pat. No. 4,272,500 to Eggerding et al. is directed to a ceramic green tape comprising a mixture of mullite and $Al_2O_3$ dispersed in a polyvinyl butyral binder.

U.S. Pat. No. 4,183,991 to Smiley et al. discloses a casting mixture comprising a dispersion of inert filler particles in a solution of polymer in monomer for preparing filled polymer sheets as thin as 0.1 inch (0.25 cm).

U.S. Pat. No. 4,301,324 to Kumar et al. is directed to a ceramic green tape in which the ceramic material is either $\beta$-spodumene or cordierite.

From the foregoing, it can be seen that much work has been directed to high temperature firing of dielectric materials in nonoxidizing atmospheres as well as low temperature firing in oxidizing atmospheres. But very little effort seems to have been directed to low temperature firing in nonoxidizing atmospheres.

DETAILED DESCRIPTION OF THE INVENTION

The main purpose for the compositions of the invention is to form a dielectric insulator to separate electrically the functional layers of a multilayer interconnection. Vitreous glasses are by themselves unsuitable for use as insulating layers in multilayer interconnections for the reason that they are resoftened during each of the subsequent firing steps. Such resoftening allows the adjacent conductive patterns to sink into the glass or to move laterally. Such positional instability can, of course, easily cause electrical shorting.

The invention overcomes this difficulty by the use with the glass of a mixture of refractory oxides which serve to inhibit resoftening of the glass during repeated firing steps.

Glass

The composition of the glass for use in the compositions of the invention is not critical by itself. It is critical only from the standpoint that it results in a glass which is noncrystallizable under the conditions of use, has a softening point ($T_s$) of at least 500° C. and a viscosity ($\eta$) of no more than $1 \times 10^6$ poises at 825°–1025° C. A glass viscosity of no more than $1 \times 10^5$ poises at the sintering temperature is preferred. It has been found that glasses having the above combination of physical properties when fired at 825°–1025° C. enable quite good burnout of the organics and have an appropriate flow characteristic at the firing temperature so that the formulation sinters to a very high density, i.e., above 93% theoretical density, thus giving a desirably nonporous layer which prevents electrical shorting of the conductive electrode layer materials with which the composition is fired. Thus, correlation of these two variables is necessary to define the viscosity-temperature characteristics of the glasses which may be used in the invention. As used herein, the term "softening point" ($T_s$) refers to dilatometric softening point.

It is essential that the glass be noncrystallizable under the conditions of use. In addition, it has been found that the glass must either (1) have no significant solubilizing effect on the refractory component of the composition, or (2) if it does significantly solubilize the refractory, the resultant solution must have an appropriately high viscosity at the firing temperature of both the initial firing step and during all subsequent firing steps. It is, however, preferred that the refractory be no more than about 20% wt. soluble in the glass and preferably no more than 10% wt. soluble.

Likewise, the amount of glass relative to the amount of refractory material is quite important. Using glasses having densities of from 2 to 4 g/cm$^3$, the amount of glass will be 40–70% by volume and preferably 45–65% by volume with complemental proportions of refractory. The precise amount of glass depends largely on the viscosity of the glass at the firing temperature(s). If the viscosity of the glass is relatively high, more glass is needed. But if the viscosity of the glass is relatively low, less glass is needed. The amount of glass is critical in that, if there is too little, the densification of the layer on firing will be insufficient. On the other hand, if too much glass is used, the layer may incur so much softening at the firing temperature that the glass flows out of the layer into adjacent conductor layers, thus causing potential shorting problems in the conductive circuits. In addition, such glass flow may cause the adjacent conductors to become very difficult to solder upon. Too much glass can also cause entrapment of organics which results in blistering of the refractory layer during subsequent firing(s). On the other hand, if the amount of glass is less than 40% by volume, the fired structure is not sufficiently densified and is therefore too porous. In consideration of these variables, it is preferred that the composition contain 45–65% volume glass.

Refractory

The refractory oxide components of the invention may, as described above, have only minimal, if any, solubility in whatever glass is used therewith. It is crucial in forming multilayer systems that the refractory layers have similar expansion properties to the substrate so that the assemblage, as it is built up into many layers, is dimensionally stable, particularly with respect to substrate bowing. Within this criterion, the refractory oxide components will be chosen so that the admixture of glass and refractory oxides will have a temperature coefficient of expansion (TCE) which approximates the TCE of the substrate on which it is applied. Thus, if the glass has a low TCE (e.g., below that of Al₂O₃), then a high TCE filler such as α-quartz and CaZrO₃ is used with the primary refractory oxide. But if a high TCE glass is used, it will be preferred to use a low TCE filler such as fused (vitreous) silica, cordierite of mullite. In other words, the TCE of the admixture of glass and primary and secondary oxides must approximate the TCE of the substrate on which the tape is applied.

As indicated above, the relative amounts of primary refractory (Al₂O₃) and secondary refractory are not narrowly critical. Thus either can constitute 1-59% by vol. of the total inorganic solids. It is, however, preferred that the Al₂O₃ be at least 5% of the total solids. Moreover, when the secondary refractory is α-quartz, CaZrO₃ or fused silica, none of these materials should constitute more than 20% by vol. of the total inorganic solids.

For the purpose of obtaining higher densification of the composition upon firing, it is important that the inorganic solids have quite small particle sizes. In particular, substantially none of the particles should exceed 15 μm and preferably they should not exceed 10 μm. It is preferred that substantially all of the inorganic solid particles lie in the range of 0.2-5 μm.

Polymeric Binder

The organic medium, in which the glass and refractory inorganic solids are dispersed, is comprised of the polymeric binder which is dissolved in a volatile organic solvent and, optionally, other dissolved materials such as plasticizers, release agents, dispersing agents, stripping agents, antifouling agents and wetting agents.

In the past, it has been possible to use a wide variety of polymeric materials as the binder for green tapes because they were fired in air at high temperatures such that the polymer, whatever it was, would be burned out rather easily. Such polymers included poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

More recently, Usala in U.S. Pat. No. 4,536,535, has disclosed an organic binder for air-fired green tapes which is a mixture of compatible multipolymers of 0-100% wt. C₁₋₈ alkyl methacrylate, 100-0% wt. C₁₋₈ alkyl acrylate and 0-5% wt. ethylenically unsaturated carboxylic acid or amine. However, most of the above-listed polymers are unsuitable for green tapes which are to be fired in a nonoxidizing atmosphere because they are insufficiently volatilized during short firing cycles at low firing temperatures, such as 825°-1025° C., and thus leave a carbonaceous residue in the ceramic layer.

Nevertheless, applicant has discovered that two very narrowly defined types of polymers are quite effective for nonoxidative firing in that they burn quite cleanly and thoroughly when fired at 825°-1025° C. in the dielectric compositions of the invention. The first of these is poly(α-methylstyrene). The second type is comprised of polymers of monofunctional methacrylates corresponding to the following chemical structure:

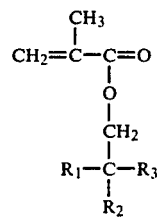

In the above-described methacrylic monomers, the α-carbon must have two or three hydrogen atoms substituents depending on whether the β-carbon is present (two hydrogen atoms) or absent (three hydrogen atoms). In addition, if the β-carbon is absent, it is replaced by a hydrogen atom as is the case with methyl methacrylate. On the other hand, if the β-carbon is present, $R_1$, $R_2$ and $R_3$ are independently selected from alkyl, aryl or aralkyl groups or, if one of the three R groups is H, then the other two R groups are preferred to be selected from alkyl, aryl or aralkyl groups.

In the case of both polymer types, it is preferred that the polymers be homopolymers or, in the case of the methacrylate polymers, that they be polymers only of monomers meeting the above criteria. Nevertheless, it has been found that both types of polymeric binders can contain up to about 15% by wt., but preferably no more than 5% by wt., of other types of comonomers and still give good nonoxidative burnout characteristics. Such other monomers include ethylenically unsaturated carboxylic acids and amines, acrylates, styrene, acrylonitrile, vinyl acetate, acrylamide and the like. Likewise, instead of using other comonomers, up to about 15% wt. other polymers not meeting the above-described criteria can be used, such as homopolymers and copolymers of the above-listed other monomers. Thus, other monomers, either as separate polymers or contained in the principal binder polymer chain, can be tolerated in the total binder polymer so long as these other materials do not exceed about 15% and preferably only about 5% of the total monomer weight of all the binder polymers present in the system.

No matter what binder polymer is used, it should have an inherent viscosity of at least 0.1 (measured in methylene chloride at 20° C.) in order to have sufficient binding strength. By and large, the upper limit of molecular weight is not critical in the practice of the invention. However, to avoid possible solvency problems, it is in some instances preferred to use polymers having inherent viscosity of no more than 1.0. Certainly, no advantage has been found to using higher molecular weight polymers. Polymers having an inherent viscosity of 0.3-0.6 have been particularly successful in the invention.

Frequently the binder polymer will also contain one or more plasticizers which serve to lower the $T_g$ of the binder polymer. Such plasticizers help to assure good lamination to ceramic substrates. The choice of plasticizers is, of course, determined primarily by the polymer which must be modified. Among the plasticizers which have been used in various binder systems are diethyl phthalate, dibutyl phthalate, butyl benzyl phthalate, dibenzyl phthalate, alkyl phosphates, polyalkylene glycols, poly(ethylene oxides), hydroxyethylated alkyl phenol, tricresyl phosphate, triethyleneglycol diacetate and polyester plasticizers. Dibutyl phthalate is frequently used in methacrylic polymer systems because it can be used effectively in relatively small concentrations.

It is particularly preferred to use binder polymers having high molecular weights in conjunction with external plasticizers, such as those described above, which volatilize cleanly leaving essentially no residue. Benzyl butyl phthalate is such a plasticizer. By this means, the plasticity of the binder can be adjusted so the tape will laminate well to the substrate and conform around underlying conductor lines and yet it will not be so tacky and weak as to make tape handling difficult.

The total amount of organic binder, including any plasticizer which it may contain, must be high enough to obtain good lamination and high tape strength, but yet not so high as to decrease the packing of the dielectric particles. If too much organic material is contained in the green tape, sintering and densification on firing are likely to be inadequate. For these reasons, it is preferred that the volume of the binder (and plasticizer if one is used) be from 30 to 55% of the volume of the solvent-free green tape. From 40 to 50% vol. is still more preferred.

Organic Solvent

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, 1,1,1-trichloroethane, tetrachloroethylene, amyl acetate, 2,2,4-triethyl pentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

Application

In making multilayer interconnections, a conductive pattern is screen printed and fired onto an inert ceramic substrate such as $Al_2O_3$ using a thick film conductive composition. Vias are then formed by punching or by laser burning a layer of green tape in an appropriate patterned array. One or more green tape layers can be used, depending upon the desired thickness of the dielectric layer. The green tape layer, or layers as the case may be, is laminated over the printed surface of the substrate and then fired at 825°–1025° C. Typical lamination conditions are 50°–70° C. at 500–2,000 psi.

After firing the laminated green tape, the vias are filled by printing over them with a thick film conductor composition and then firing. After the filled vias are fired, one or more patterned functional layers is printed atop the fired tape. It will be recognized that a printed capacitor or resistor may be printed on the layer as well as a conductive circuit. Each of the functional layers will ordinarily be fired separately before adding the next layer. However, in some instances, it may be possible to cofire the functional patterns which are printed on a given layer of fired tape. It may also be possible to cofire the filled vias with the functional layer(s). By repeating the sequence of these steps (excluding the initial substrate printing step), a complex multilayer structure can be built up comprising a number of interconnected functional layers, each separated by a densified layer of dielectric.

It will be recognized by those skilled in the art that in each of the above-described laminating steps, the layers must be accurate in registration so that the vias are properly connected to the appropriate contact points of the adjacent functional layer.

The term "functional layer" refers to the layers printed on the ceramic green tape which have either conductive, resistive or capacitive functionality. Thus, a typical green tape layer may have printed thereon one or more resistor circuits and/or capacitors as well as one or more conductive circuits.

As used herein, the term "firing" means heating the layer in question in a nonoxidizing atmosphere, such as nitrogen, to a temperature and for a time sufficient to volatilize (burnout) all of the organic material in the layer and to sinter and densify the inorganic solids.

Test Procedures

Dissipation Factor (DF) is a measure of the phase difference between voltage and current. In a perfect capacitor, the phase difference would be 90°. However, in practical dielectric systems, DF is less than 90° because of leakage and relaxation losses. In particular, DF is the tangent of the angle by which the current lags the 90° vector. In practice, DF is a measure of internal power losses due to conduction through the dielectric from one lead to the other.

Dielectric Constant (K) is a measure of the ability of a dielectric material to store an electrical potential energy under the influence of an electrical field. Thus, it is the ratio between the capacitance of a capacitor with the subject material as dielectric (the fired dielectric in this case) to the capacitance of a capacitor with a vacuum as the dielectric.

EXAMPLE

EXAMPLE 1

A ceramic slip was prepared by ball milling the following constituents for 16 hours:
211.4 g Glass Frit
31.7 g Quartz
133.0 g Alumina
50.0 g Poly(Methyl Methacrylate)*
60.0 g Benzyl Butyl Phthalate
250.0 g Methyl Ethyl Ketone

*Elvacite 2010, Elvacite is a registered trademark of E. I. du Pont de Nemours & Co., Wilmington, DE for poly(methyl methacrylate) resins. Elvacite 2010 has an inherent viscosity of 0.4.

The glass frit had the composition by weight:
56.5% $SiO_2$
17.2% $PbO_2$
9.1% $Al_2O_3$
8.6% $CaO$
4.5% $B_2O_3$
2.4% $Na_2O$
1.7% $K_2O$ The inorganic solids charged to the ball mill were finely divided powders. The glass frit had a surface area of 2.7

$m^2/g$, the quartz a surface area of 8 $m^2/g$ and the alumina had a surface area of 3.7 $m^2/g$.

Following ball milling, the ceramic slip was cast onto a silicone-treated 1 mil Mylar®** polyester film at a wet thickness of approximately 15 mils and allowed to dry at room temperature by solvent evaporation. The resultant green tape was cut into approximately 0.6 in. squares and laminated to a 1×1 in. substrate of 96% alumina containing a prefired circular electrode of Du Pont 9924 thick film copper paste. Laminating was performed at 50° C. with 500 psi pressure for 15 minutes. The tape adhered well to the substrate and conformed well around the printed copper pattern. Following lamination, the Mylar backing was removed and the laminate fired in a thick film conveyor furnace in a nitrogen atmosphere. The firing cycle was 1 hour in length and had a peak firing temperature of 900° C. for 10 minutes. The fired dielectric was flat, with no edge curling, and contained no cracks or tears.

**Mylar is a registered trademark of E. I. du Pont de Nemours & Co., Wilmington, DE for polyester resin film.

Next, the circuit was completed by printing and firing a top circular electrode of copper to form a capacitor.

The thusly formed capacitor was of high quality, with no shorting between electrodes and had a fired dielectric thickness of about 3.0 mils.

Capacitance and dissipation factor were measured on a Hewlett-Packard Model 4262A LCR Meter at a frequency of 1 KHz Dissipation factor was 0.3-0.5% and a dielectric constant of 6.5-7.5 was calculated from the observed capacitance and capacitor geometry.

I claim:

1. A castable dielectric composition comprising
   (1) An admixture of finely divided inorganic solids comprising
      a. 40-70% vol. noncrystallizable glass having a softening point ($T_s$) of at least 500° C. and a viscosity (n) of $1 \times 10^6$ poises or less at 825°-1025° C.; and
      b. 60-30% vol. of a mixture of refractory oxides comprising 1-59% vol. $Al_2O_3$ and 59-1% volume of a secondary refractory selected from α-quartz, $CaZrO_3$ or fused silica being 20% vol., basis total inorganic solids,
      the admixture of inorganic solids being dispersed in
   (2) An organic medium comprising a solution of
      c. a polymeric binder selected from poly(α-methyl styrene) and polymers of methacrylates corresponding to the formula:

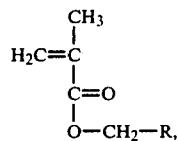

in which R is selected from —H and

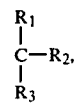

in which (1) $R_1$, $R_2$ and $R_3$ are independently selected from —H, alkyl, alkaryl and aralkyl groups and (2) no more than one of $R_1$, $R_2$ and $R_3$ is —H, the glass transition temperature of the polymer, including any plasticizer therein, is −30° to +20° C., and
      d. volatile nonaqueous organic solvent, the volume of organic medium being 30-55% of the volume of the dispersed inorganic solids a. and b.

2. The composition of claim 1 in which the noncrystallizable glass is a lead calcium aluminum borosilicate glass.

3. The composition of claim 2 in which the noncrystallizable glass has the composition by weight 56.5% $SiO_2$, 17.2% $PbO_2$, 9.1% $Al_2O_3$, 8.6% CaO, 4.5% $B_2O_3$, 2.4% $Na_2O$ and 1.7% $K_2O$.

4. A method of forming a dielectric green tape by casting a thin layer of the dispersion of claim 1 onto a flexible substrate and heating the cast layer to remove the volatile organic solvent therefrom.

5. A method for forming a multilayer interconnection comprising the steps of:
   a. printing and firing a patterned layer of thick film conductor composition on an inert ceramic substrate;
   b. forming a patterned array of vias in one or more layers of green tape made by the process of claim 4;
   c. laminating the green tape layer(s) of step b. having vias therein over the printed side of the assemblage of step a. and firing the assemblage at 825°-1025° C. to form a densified layer of dielectric;
   d. filling the vias in the densified dielectric layer of step c. with a thick film conductor composition and firing the assemblage;
   e. printing and firing at least one patterned thick film functional layer over the fired assemblage of step d.; and
   f. repeating the sequence of steps b. through e. for a number of times sufficient to build up a predetermined number of interconnected functional layers, each separated by a densified layer of dielectric.

* * * * *